(12) United States Patent
Schmidhammer

(10) Patent No.: US 8,143,967 B2
(45) Date of Patent: Mar. 27, 2012

(54) IMPEDANCE MATCHING METHOD

(75) Inventor: Edgar Schmidhammer, Stein An Der Traun (DE)

(73) Assignee: Epcos AG, Munich (DE)

( * ) Notice: Subject to any disclaimer, the term of this patent is extended or adjusted under 35 U.S.C. 154(b) by 185 days.

(21) Appl. No.: 12/760,053

(22) Filed: Apr. 14, 2010

(65) Prior Publication Data

US 2010/0265003 A1    Oct. 21, 2010

(30) Foreign Application Priority Data

Apr. 17, 2009    (DE) .................... 10 2009 017 945

(51) Int. Cl.
   *H03H 7/38*    (2006.01)

(52) U.S. Cl. ..................................... 333/17.3

(58) Field of Classification Search ............. 333/17.3, 333/33
    See application file for complete search history.

(56) References Cited

U.S. PATENT DOCUMENTS

| | | | |
|---|---|---|---|
| 3,919,643 A | 11/1975 | Templin | |
| 4,763,087 A | 8/1988 | Schrader | |
| 5,225,847 A | 7/1993 | Roberts et al. | |
| 5,589,844 A | 12/1996 | Belcher et al. | |
| 6,895,225 B1 | 5/2005 | Talvitie et al. | |
| 6,961,368 B2 | 11/2005 | Dent et al. | |
| 2004/0009754 A1 | 1/2004 | Smith, Jr. | |
| 2005/0215204 A1 | 9/2005 | Wallace et al. | |
| 2005/0255818 A1 | 11/2005 | Watabe | |
| 2006/0160501 A1 | 7/2006 | Mendolia et al. | |
| 2007/0063788 A1 | 3/2007 | Zhu et al. | |
| 2007/0194859 A1 | 8/2007 | Brobston et al. | |
| 2008/0274706 A1 | 11/2008 | Blin | |
| 2011/0063042 A1* | 3/2011 | Mendolia et al. ............ 333/17.3 |

FOREIGN PATENT DOCUMENTS

| | | |
|---|---|---|
| EP | 0685936 A2 | 6/1995 |
| WO | 2008133854 A1 | 11/2008 |
| WO | 2008134074 A1 | 11/2008 |
| WO | 2008137152 A1 | 11/2008 |

OTHER PUBLICATIONS

HRL Laboratories Demonstrates World's First Graphene RF Field-Effect Transistors Under DARPA's CERA Program; (1 page); (dated Apr. 16, 2009).
IEEE Microwave Magazine, HRL Laboratories Demonstrates the World's First Graphene RF Field-Effect Transistors, at p. 144 (1 page); (dated Apr. 16, 2009).

* cited by examiner

*Primary Examiner* — Stephen Jones
(74) *Attorney, Agent, or Firm* — Nixon Peabody LLP

(57) ABSTRACT

An impedance matching method which is used to save electrical energy by virtue of the fact that the method switches between modes for controlling impedance matching and modes for regulation of the impedance matching depending on the situation. An algorithm which, on the basis of control signals from an external circuit environment, controls or regulates the impedance of a variable-impedance circuit element is implemented in a logic circuit LC.

16 Claims, 4 Drawing Sheets

IMPEDANCE MATCHING METHOD

CROSS-REFERENCE TO RELATED APPLICATION

This application claims the benefit under 35 U.S.C. §119 of Germany Patent Application Serial No. 10 2009 017 945.3, filed in Germany on Apr. 17, 2009, entitled "Impedance Matching Method."

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE DISCLOSURE

Aspects of the present invention relate to methods for matching the impedance of a signal line to a variable-impedance circuit element in an energy-saving manner.

BACKGROUND

The impedances of radiofrequency (RF) signal lines and circuit elements provided for RF signals should be matched to one another in order to minimize undesirable reflections of the signals, for example during the transition from the RF line to a circuit element, or to minimize attenuation of the signal strength.

In mobile communication devices, for example, the impedance of an antenna, which may be variable, should be adapted to the impedance of the circuit component electrically connected thereto, for example a front-end circuit. The impedance of the antenna of a mobile communication device is variable, in particular, when the antenna is a planar antenna whose impedance greatly depends on the spatial distance from other objects or on other external influences.

U.S. Patent Application Publication No. 2008/0274706 A1 discloses an impedance matching circuit of a mobile communication device. The impedances of an antenna and the signal path of the front-end circuit are matched by means of tuning, i.e. means of adaptive matching with the aid of an impedance matching circuit that is electrically connected between a power amplifier and the antenna. The measured transmission power which is determined by a coupler, which is coupled to the signal path, is used as the basis for the adaptive matching, for example. The impedance is continuously matched to the current (load) impedance of the antenna in a control loop.

A problem with known impedance matching circuits is that the adaptive impedance matching, which is carried out in a control loop, also consumes electrical power—for example from a rechargeable battery of a mobile communication device—even when impedance matching is not actually required at all. Impedance matching may be unnecessary if the impedance has been well-matched and the load impedance does not change. One example of such a situation is when the mobile communication device is electrically connected to an external antenna (for example an external antenna on the roof of an automobile). A similar situation occurs when the signal path of the mobile communication device is electrically connected—for example for test purposes—to circuits of an external test environment. Nevertheless, the load impedance may also change over time in such cases.

Another problem with known impedance matching circuits is the complexity of modern multiband/multimode communication devices, in particular those having a plurality of antennas. A regulating system for adaptively matching the impedance of a frequency band generally does not function if it is operated at frequencies in another frequency band. In particular, said system does not function when it is operated in different bands.

Another problem with known impedance matching circuits is that of matching the load impedances of variable-impedance circuit elements when a corresponding device has a plurality of variable-impedance circuit elements, in particular when these circuit elements interact with one another. One example of this situation is a modern communication device in which a plurality of antennas are installed. The plurality of antennas may be provided, for example, in order to serve different frequency bands or to operate in different transmission systems (for example GSM, W-CDMA, etc.). An increased energy requirement is produced, for example, by virtue of the fact that an antenna which is not operating interacts with an operating antenna and interferes with good adaptive matching of the operating antenna.

Impedance matching circuits known from the prior art only match the impedance of antennas which are currently operating. The interaction between an operating antenna and a second antenna which is currently not operating may result in the abovementioned problem that the emission of the active antenna is impaired by interaction with the inactive antenna.

Another problem with known impedance matching circuits is that the emitted RF power is measured as the basis for the impedance matching. However, if the emitted RF power is too low to draw meaningful conclusions on the impedance matching, the impedance matching operation unnecessarily consumes energy, while effective impedance matching is not guaranteed.

In particular, since the trend is moving towards ever smaller, more powerful, and lighter mobile communication devices, there is an interest in having an impedance matching method available which has a reduced energy requirement in comparison with known methods.

Therefore, a need exists for an energy-saving impedance matching method, which accounts for a multiplicity of different situations and carries out impedance matching in an optimum manner despite different situations. Aspects of the present disclosure are directed to satisfying these and other needs.

SUMMARY

Aspects of the present disclosure are directed to impedance matching circuits and methods. According to an aspect, there is provided a method for matching the impedance of a first signal line of a signal path to a first variable-impedance circuit element in an energy-saving manner by means of an impedance matching circuit. The impedance matching circuit is electrically connected to an external circuit environment, which is external to the impedance matching circuit. The impedance matching circuit comprises a first matching network which is electrically connected to the first signal line and whose impedance is regulated or controlled. The impedance matching circuit comprises a logic circuit in which an algorithm for regulating and controlling the first matching network and for monitoring control signals from the external circuit environment is implemented. The method can also have the following features:

the algorithm is always active in an active mode selected from at least two different modes, which include a regulation mode for regulating the impedance of the first matching network, a control mode for controlling the impedance of the first matching network, and a monitoring mode for monitoring control signals from the external circuit environment, or combinations of the regulation, control, or monitoring modes, the respective active mode of the algorithm changes to a respective different mode at an interval of time (e.g., the active mode changes from the regulation mode to the control mode at an interval of time), which time interval can be varying, the control signals from the external circuit environment determine the respective active mode in this case, the impedance of the first matching network is controlled in the control mode, and the impedance of the first matching network is set to a defined value in the regulation mode.

In this example, the first signal line may be a signal line of a signal path of a mobile communication device. In this example, the first variable-impedance circuit element may be an antenna, for example a planar antenna, of the mobile communication device. The external circuit environment may be implemented by means of other, further circuit components or logic components of the mobile communication device (for example the external circuit environment of the mobile communication device can include a graphics processor, a microcontroller, etc.). The first signal line may be balanced (symmetrical) or unbalanced (asymmetrical/electrically connected to ground). A signal path may comprise two signal lines, for example.

The algorithm may be active in the control mode for controlling the impedance of the first matching network. This means that the impedance is adaptively matched in a control loop. In other words, the variable-impedance circuit element is tuned dynamically.

The algorithm may also be active in the regulation mode in which the impedance of the first matching network is regulated rather than controlled. This means that the impedance of the matching network is firmly set (regulated) to a fixed, defined value. The impedance is not adaptively matched (i.e. there is no dynamic tuning) in the regulation mode.

The fact that the mode of the algorithm changes between the control mode and the regulation mode, depending on the situation and requirement, ensures, on the one hand, that good matching is always achieved and, on the other hand, that energy consumption is reduced. Control signals from the external circuit environment are monitored by the algorithm to determine whether the algorithm should be placed in the control mode or in the regulation mode, for example.

The control signals from the external circuit environment can determine the mode of the algorithm and, for this purpose, take into account, for example, the state of charge of the rechargeable battery, the RF power fed into the signal path, or the operating state of the antennas. In particular, the impedance matching may be regulated (instead of controlled) if the RF power fed in is low—because the state of charge of the rechargeable battery is low for example—and tuning is not readily possible. In such a case, the control signals indicate to the algorithm that its active mode should be the regulation mode. If the active mode of the algorithm is not in the regulation mode, the algorithm changes its active mode to be placed in the regulation mode. In contrast, if the RF power fed in is high, the impedance matching may or should be controlled (instead of regulated). In such a case, the control signals indicate to the algorithm that its active mode should be the control mode. If the active mode of the algorithm is not in the control mode, the algorithm changes its active mode to be placed in the control mode.

The methods disclosed herein therefore differ from known dynamic impedance matching methods in that, in cases in which it is not possible or is undesirable to control the impedance matching, the impedance matching is regulated, thereby reducing the energy consumption.

In an embodiment of the present disclosure, the following can be executed iteratively in the control mode for controlling the impedance of the first matching network, thereby adaptively matching or dynamically tuning the impedance of the first matching network to the variable-impedance circuit:

A: instantaneous matching is determined with the aid of a first circuit for determining the impedance matching;

B: a new value of the impedance of the matching network is determined;

C: a new value of the impedance of the matching network is set;

D: repeat A-C.

In this example, the first circuit for determining the impedance matching may be, for example, a directional coupler which is electrically connected to signal lines of the signal path and detects the instantaneous emission power, for example. Alternatively, the first circuit for determining the impedance matching may also be a circuit for detecting the VSWR (voltage standing wave ratio) of RF signals in the signal path or the relative phase angle of the RF signals in the signal path. It is also contemplated to provide a circuit for determining or estimating the value of the complex-value impedance.

In another embodiment of the present disclosure, in the regulation mode, the value of the impedance of the first matching network can be set to a defined value, on the basis of the frequency band in which data are transmitted in the first signal path, and/or the type of the first variable-impedance circuit element, such as an external test circuit, a PILA (Planar Inverted L Antenna), a PIFA (Planar Inverted F Antenna), a planar antenna, a rod antenna, a power amplifier, or a receiving amplifier.

In another embodiment of the present disclosure, the control signals from the external circuit environment can determine the respective active mode on the basis of a supply voltage, such as a voltage of a battery, which serves at least parts of the electrical circuits in the external circuit environment or the impedance matching circuit, or the type of the first variable-impedance circuit element, such as an external test circuit, a PILA, a PIFA, a planar antenna, or a rod antenna.

The elements listed above therefore influence not only the specific configuration of the adaptive impedance matching but also whether the impedance matching is regulated in the regulation mode or controlled in the control mode.

In another embodiment, the impedance matching circuit further includes a second signal line, a second variable-impedance circuit element, and a second matching network. The second matching network is electrically connected to the second signal line, the latter being electrically connected to the second variable-impedance circuit element. The impedance of the second matching network is regulated or controlled by the algorithm in order to match the impedance (either dynamically in the case of the control mode or to a defined value in the case of the regulation mode) of the second signal line to the second variable-impedance circuit element.

A second circuit for determining the impedance matching of the second variable-impedance circuit element can be electrically connected to the second signal line.

Such a method makes it possible, for example, to match two different antennas of a mobile communication device in such a manner that the power consumption is minimal and the impedance matching is good when one antenna or both antennas is/are operating. Particularly when only one of the antennas is operating and requires adaptive, dynamic impedance matching, the impedance of the matching network of the other antenna can be set to values at which optimum RF signal emission takes place for the first antenna. The energy situation is then improved with regard to the situation in which both antennas are tuned.

In an advantageous embodiment, the impedance of one of the matching networks is thus controlled in a control mode for controlling the impedance, while the impedance of the other matching network is simultaneously regulated in a regulation mode. The impedance of one matching network is controlled in the control mode and the impedance of the other matching network is regulated in the regulation mode in such a manner that the impedance matching is optimal for the controlled matching network.

In another embodiment, the regulation of the impedance of a matching network in the regulation mode can be synchronized with control signals from the external circuit environment. For example, the control signals can indicate changeover times in which RF data are transmitted or received, and the periodicity with which the control signals regulate the impedance of the matching network is matched can be synchronized with the changeover times. Such a method is advantageous, for example, when a mobile communication device which is operated in TDD (Time Division Duplexing) is involved. The TDD method changes over between time slots in which signals are respectively transmitted or received.

If the adaptive impedance matching steps which are carried out iteratively in the control mode are synchronized with the changeover times of TDD operation, it is possible to effectively prevent interfering frequency components from occurring in or during a time slot for transmitting or receiving RF signals as a result of the impedance matching circuit being tuned. It is preferable to vary the impedance of the matching networks during a TDD changeover operation. This improves, in particular, the reception of RF signals of relatively weak power.

However, it can also be advantageous to control the impedance of a matching network in an asynchronous manner with respect to the control signals from the external circuit environment. If a mobile communication device operated in a corresponding manner is in an FDD (Frequency Division Duplexing) mode, for example, in which data are continuously transmitted and received, the impedance cannot be matched in synchronism with changeover times. Control signals from the external circuit environment may also occur at arbitrary times which cannot be foreseen (for example on an interrupt-controlled basis), with the result that synchronization of the matching steps with the signals from the external circuit environment would impair the impedance matching quality.

Impedance matching controlling steps are preferably carried out in such a manner that severe phase changes in the transmission signal caused by drastic impedance matching are reduced. In particular, it may be advantageous if the change in the phase of the transmission signal is less than or equal to 15° for each controlling iteration while dynamically tuning the impedance of the matching network in the control mode.

The variable-impedance circuit element is preferably an antenna of a mobile communication device. Alternately, the variable-impedance circuit element can be a switching element that electrically connects the impedance matching circuit to an external test circuit or other circuit. Instead of an external test circuit for test purposes, any other circuit (for example an external antenna) is also contemplated irrespective of whether its impedance varies quickly or slowly over time compared to the conventional antenna of a mobile communication device. This is because the impedance matching algorithm disclosed herein is suitable for all such cases.

A matching network whose impedance can be regulated or controlled may comprise switching units whose impedance can be set. An embodiment of the present disclosure, thus, involves using one or more matching networks which comprise a switching unit that is a switchable capacitance matrix using radiofrequency (RF) microelectromechanical systems (MEMS) technology, a switchable capacitance matrix using complementary metal-oxide-semiconductor (CMOS) technology, a switchable capacitance matrix using n-type metal-oxide-semiconductor (NMOS) or p-type metal-oxide-semiconductor (PMOS) technology, a switchable capacitance matrix using gallium arsenide (GaAs) technology, a switchable capacitance matrix using silicon-germanium (SiGe) technology, a switchable capacitance element using barium strontium titanate (BST) technology, a switchable capacitance element using bismuth zinc niobate (BZN) technology, a switchable capacitance element using carbon technology, a switchable capacitance element with graphene field-effect transistors (FETs), or a switching unit which is based on technologies which operate with ferroelectric materials.

A switchable capacitance matrix which operates with synthetic materials comprising carbon (for example graphene) can be used, for example, as the switchable capacitance element using carbon technology. In particular, capacitance elements which operate with graphene FETs (field effect transistors) may be suitable.

The logic circuit in which the algorithm is implemented can be integrated in a microcontroller, in a baseband chipset, in an RF chipset, in an ASIC (Application Specific Integrated Circuit), or in another IC (Integrated Circuit). The algorithm can be implemented as firmware, software, or other non-transitory medium, in the logic circuit in the form of machine-readable instructions.

RF signals may propagate in succession or at the same time (in the case of a plurality of signal lines in the signal path) in the signal path. These RF signals may propagate in a first frequency band or in a second frequency band different from the first frequency band.

In an embodiment, the method can be used in a multiband or multimode mobile radio device.

In an embodiment, transmission or reception data from the RF signals are processed using a modulation scheme such as, for example, CW (Continuous Wave), GSM (Global System for Mobile communications), W-CDMA (Wide Band Code Division Multiple Access), LTE (Long Term Evolution, a UMTS successor mobile radio standard), or OFDM (Orthogonal Frequency Division Multiplex). As part of the LTE standard, the following (modulation) schemes, which can be used individually or in combination during data transmission, can also be used: QAM (Quadrature Amplitude Modulation), COFDM (Coded Orthogonal Frequency Division Multiplex), TCM (Trellis-Coded Modulation), BCM (Block Code Modulation), MLCM (Multilevel Code Modulation), BOC (Binary Offset Carrier), FHSS (Frequency Hopping Spread Spectrum), or DSSS (Direct-Sequence Spread Spectrum).

It is also contemplated to find optimum matching parameters in the control mode and to switch then to the regulation mode and to firmly set and retain the parameters (e.g., impedance value of the matching network) which have been determined. In contrast to known designs in which regulation is based on a look-up table, a system in which adaptive matching is carried out by an algorithm is more flexible. Accordingly, memory modules storing such a look-up table are no longer needed.

In order to measure the instantaneous impedance matching in the control mode, it is possible to use only the magnitude but not the phase of the RF signals in the signal path. The circuit complexity is then reduced.

A matching circuit disclosed herein can include, for example, capacitance matrices in which switching units are electrically connected, such as, for example five variable-impedance switching units (for example varactors). If each varactor has two switchable capacitance values, the result is a total of 32 possible different states. In addition to variable-capacitance capacitance elements, circuit units in which the inductance can be set in a variable manner are also suitable.

Switching units whose impedance can be set in discrete steps are suitable. However, switching units whose impedance can be set continuously in particular intervals are also suitable.

The impedance matching circuits and methods are explained in more detail below using exemplary embodiments and associated schematic figures, in which:

DETAILED DESCRIPTION

Figure 1:
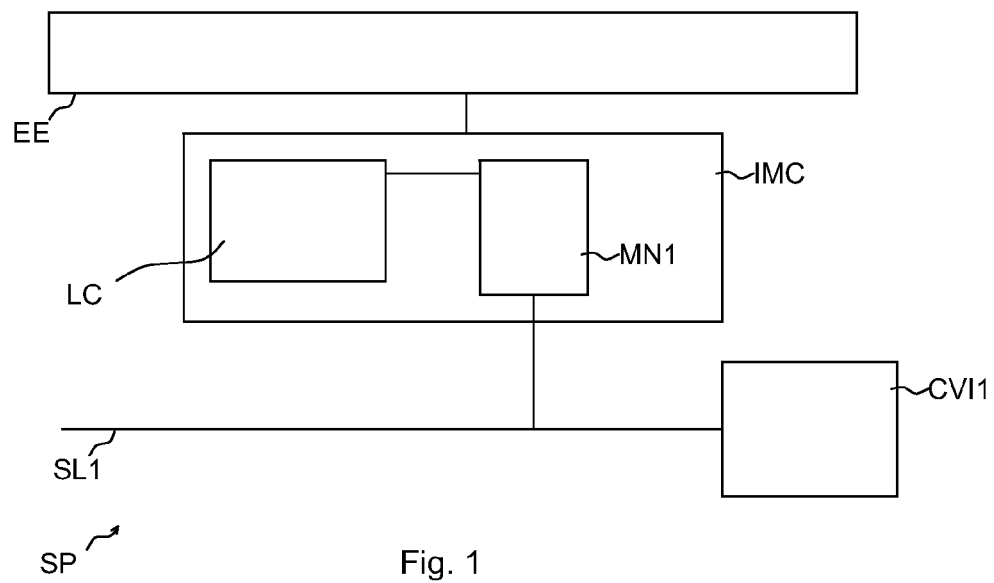
FIG. 1 shows the schematic electrical connection of an impedance matching circuit to an external circuit environment and to the signal line of a signal path.

FIG. 1 shows a schematic electrical connection of an impedance matching circuit IMC to an external circuit environment EE and to a signal path SP, which connection can be used in the methods according to the present disclosure. The impedance matching circuit IMC comprises a logic circuit LC and a first matching network MN1 that is electrically connected to the logic circuit LC. The impedance matching circuit IMC is electrically connected to an external circuit environment EE. The first matching network MN1 of the impedance matching circuit IMC is electrically connected to a first signal line SL1 of the signal path SP. The first signal line SL1 is also electrically connected to a variable-impedance circuit element CVI1.

Figure 2:
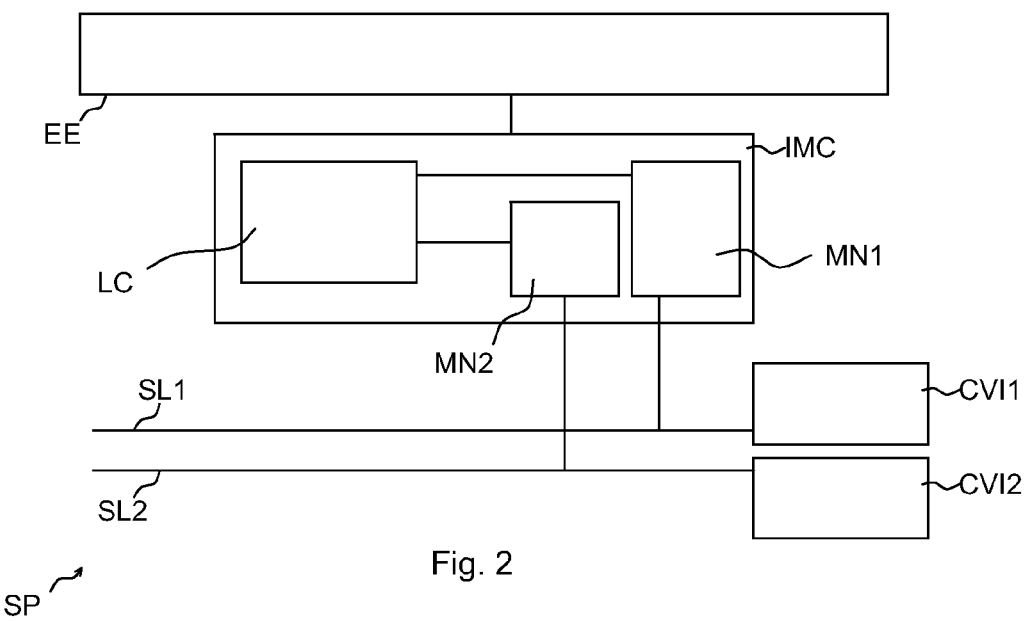
FIG. 2 shows the schematic electrical connection of the impedance matching circuit to an external circuit environment and to two signal lines of the signal path.

FIG. 2 illustrates an electrical connection of the impedance matching circuit IMC, which connection can be used in the impedance matching methods disclosed herein. The impedance matching circuit is electrically connected to an external circuit environment EE, the impedance matching circuit IMC comprising a logic circuit LC, a first matching network MN1 and a second matching network MN2. The first matching network MN1 is electrically connected to a first signal line SL1 of the signal path SP. The second matching network MN2 is electrically connected to a second signal line SL2 of the signal path SP. The first signal line SL1 is electrically connected to a first variable-impedance circuit element CVI1, while the second signal line SL2 is electrically connected to a second variable-impedance circuit element CVI2. The logic circuit LC is electrically connected to both the first matching network MN1 and the second matching network MN2.

Figure 3:
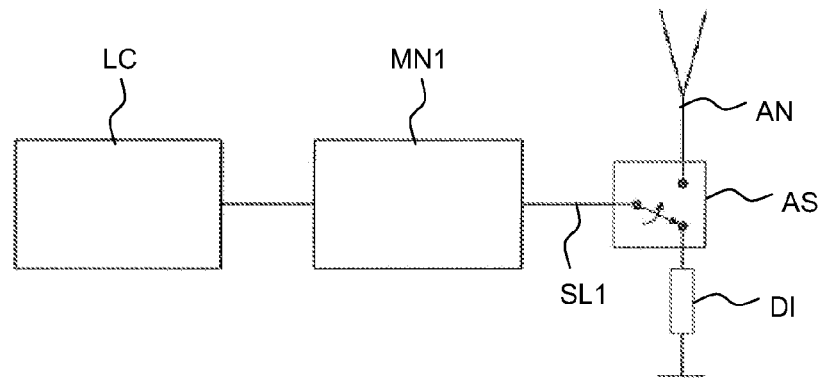
FIG. 3 shows the electrical connection of a matching network to a logic circuit and to a switch which connects the signal path either to an antenna or to a defined circuit environment.

FIG. 3 shows an embodiment of the impedance matching circuit, a first matching network MN1, which is electrically connected to a logic circuit LC, also being electrically connected, via a first signal line SL1, to a switch AS which connects the first signal line SL1 to either an antenna AN or to a defined impedance DI. The defined impedance DI which is illustrated symbolically here can be implemented as an impedance of an external test environment, for example.

Figure 4:
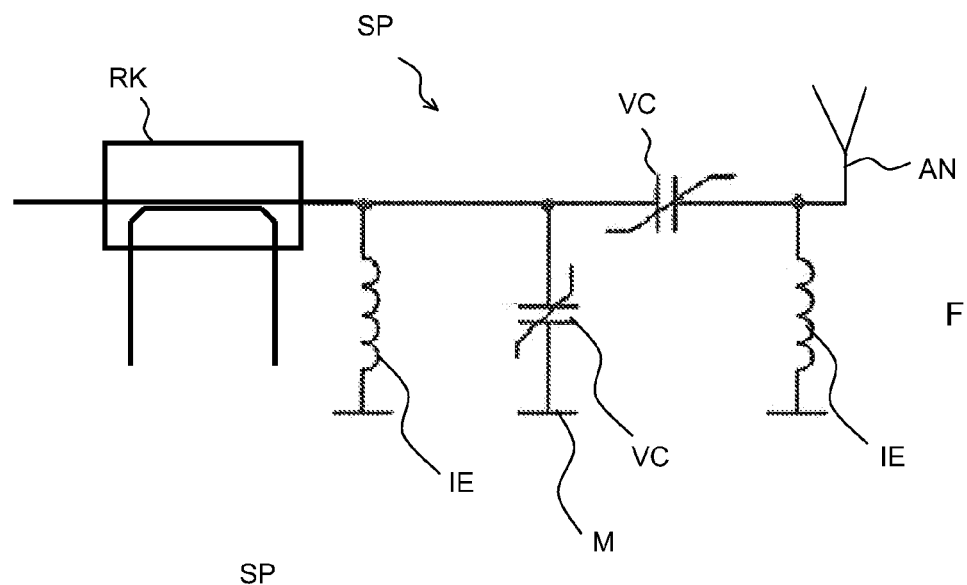
FIG. 4 shows an embodiment of the matching circuit with inductive and capacitive circuit units.

FIG. 4 shows an embodiment of an impedance matching network in which variable-capacitance switching units VC and inductive elements IE are electrically connected. A variable-capacitance switching unit VC is electrically connected in series with a signal path SP. A further variable-capacitance switching unit VC connects the signal path to ground M. An inductive element connects the antenna, which is electrically connected to the signal path, to ground. A detector RK, for example a directional coupler, is electrically connected in series within the signal path. If the system is in the control mode for controlling the impedance, the signal measured by the directional coupler is used as a benchmark for determining the impedance matching quality.

Figure 5:
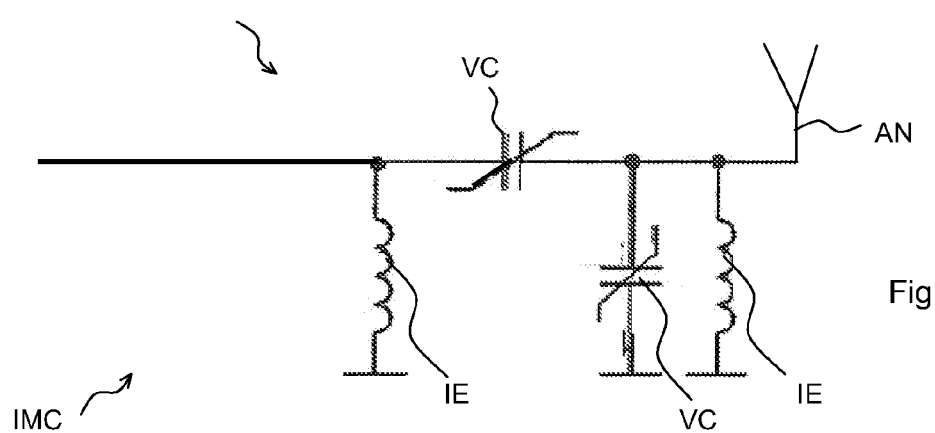
FIG. 5 shows a further embodiment of an impedance matching circuit.

FIG. 5 shows an alternative embodiment of an impedance matching network IMC in which a variable-capacitance switching unit VC is again electrically connected in series with a signal path SP. However, on the antenna side, the signal path SP is electrically connected to ground via both a further variable-capacitance switching unit VC and an inductive element IE.

It is advantageous for each signal line of the signal path to be electrically connected, on the antenna side, to ground via an inductive element IE because undesirable interference signals, for example ESD pulses, can be discharged via ground without destroying downstream circuit elements.

Figure 6:
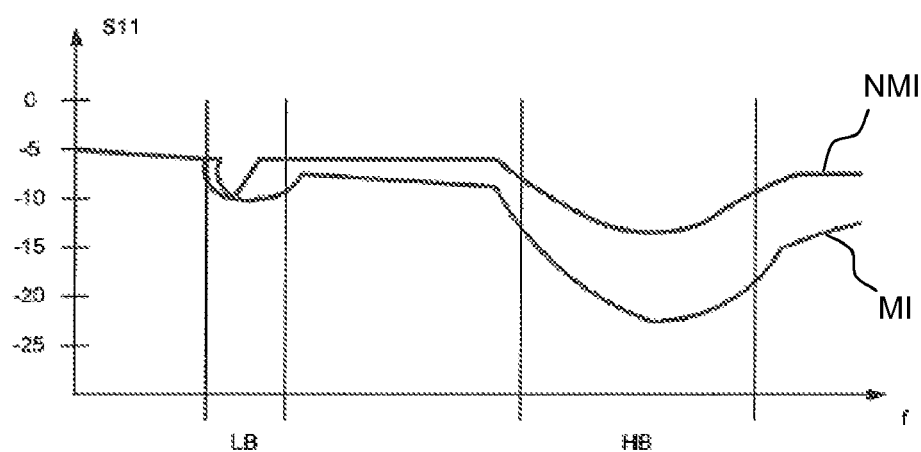
FIG. 6 shows the profile of the reflection coefficient on the basis of the impedance matching.

FIG. 6 shows the simulated profile of two frequency-dependent reflection coefficients. Both curves describe the reflection coefficient of the active antenna in a system having two antennas. The respective other antenna is inactive, i.e. it is not transmitting or receiving any data. The curve denoted NMI (non-matched impedance) shows the profile of the reflection coefficient, the impedance of the antenna which is not operating not being matched to optimized transmission of the active antenna. In contrast, MI (matched impedance) denotes the reflection coefficient of an antenna which is operating, the impedance of the corresponding inactive antenna being matched to optimized transmission of the antenna which is operating.

The reflection coefficient of the active antenna is considerably reduced, especially in the important data transmission frequency bands (in this case, LB denotes a lower band and HB denotes an upper band of a multiband communication device), because the impedance of the inactive antenna has been matched in a corresponding manner. A reduced reflection coefficient signifies an increase in the power which can be emitted. In particular, the power fed into the signal path can be reduced since fewer reflection losses occur. The energy consumption is thus reduced.

Figure 7:
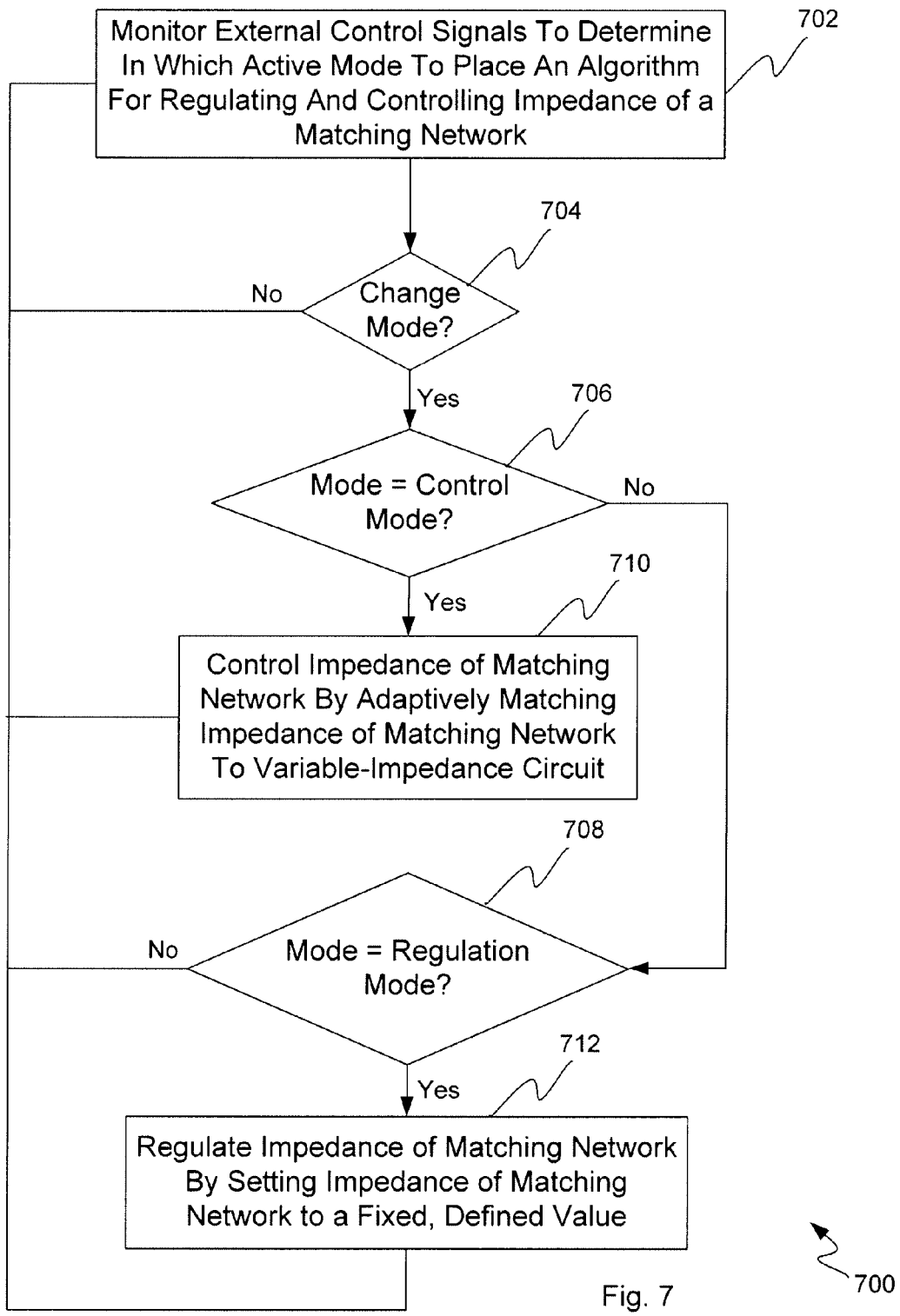
FIG. 7 is a flowchart diagram of an algorithm for matching the impedance of a matching network to a variable-impedance circuit element in an energy-saving manner.

FIG. 7 is a flowchart diagram of an algorithm 700 for matching the impedance of the first/second matching network MN1/MN2 to the first/second variable impedance circuit CVI1/CVI2 in an energy-saving manner according to the present invention. The algorithm 700 monitors the control signals from the external circuit environment EE to determine in which active mode the place the algorithm 700 (702). If the control signals indicate that the active mode of the algorithm 700 is to be changed (704), the algorithm 700 determines whether its active mode should be the control mode (706), and, if so, changes the mode to the control mode, which controls the impedance of the matching network MN1/MN2 by adaptive matching or dynamically tuning the impedance of the matching network to the variable-impedance circuit CVI1/CVI2 (710). If the controls signals indicate that the active mode of the algorithm 700 should be in the regulation mode (708), the algorithm 700 changes its mode to the regulation mode, which regulates the impedance of the matching network MN1/MN2 by setting the impedance of the matching network to a fixed, defined value (712).

Methods disclosed herein are not restricted to one of the exemplars described. Combinations of different modes or combinations of embodiments of the matching circuit, which comprise yet further inductive or capacitive elements for example, are likewise exemplary embodiments according to the present disclosure.

List of reference symbols:
  EE: External circuit environment
  IMC: Impedance matching circuit
  LC: Logic circuit
  MN1: First matching network
  MN2: Second matching network
  SP: Signal path
  SL: Signal line
  CVI: Variable-capacitance circuit element
  AN: Antenna
  AS: Antenna switch
  DI: Defined external impedance
  RK: Directional coupler
  VC: Variable-capacitance switching unit
  IE: Inductive element
  LB, HB: Low band, high band
  NMI, MI: Non-matched impedance, matched impedance; frequency-dependent reflection coefficient when the impedance is not matched

What is claimed is:

1. A method for matching an impedance of a first signal line of a signal path to an impedance of a first variable-impedance circuit element in an energy-saving manner using an impedance matching circuit electrically connected to an external circuit environment, the impedance matching circuit including
  a first matching network electrically connected to the first signal line and having an impedance that is regulated or controlled by a logic circuit electrically connected to the first matching network, and
  an algorithm implemented in the logic circuit for regulating and controlling the impedance of the first matching network and for monitoring control signals from the external circuit environment,
the method comprising:
  causing the algorithm to always be active in a mode selected from at least two different active modes, wherein the at least two different active modes include a regulation mode for regulating the impedance of the first matching network, a control mode for controlling the impedance of the first matching network, or a monitoring mode for monitoring the control signals or any combination of the regulation mode, control mode, and the monitoring mode;
  changing the mode of the algorithm to a different one of the at least two different active modes at an interval of time, wherein the control signals are monitored in the monitoring mode to determine which of the at least two active modes the algorithm is in;
  controlling the impedance of the first matching network responsive to the mode of the algorithm being in the control mode; and
  setting the impedance of the first matching network to a defined value responsive to the mode of the algorithm being in the regulation mode.

2. The method as claimed in claim 1, wherein the control mode is configured to adaptively match the impedance of the first matching network to the impedance of the first variable-impedance circuit, the method further comprising carrying out iteratively the following responsive to the mode of the algorithm being in the control mode:
  responsive to the impedance of the first-variable impedance circuit changing, determining, in at least a first circuit, a new value of the impedance of the first matching network such that the new impedance of the first matching network matches the impedance of the first variable-impedance circuit; and
  setting the impedance of the first matching network to the new value.

3. The method as claimed in claim 1, wherein the setting the defined of the impedance of the first matching network in the regulation mode is based on
  the frequency band in which data are transmitted in the first signal path, or
  the type of the first variable-impedance circuit element, the first variable-impedance circuit element being an external test circuit, a planar antenna, a planar inverted L antenna (PILA), a planar inverted F antenna (PIFA), a rod antenna, a power amplifier, or a receiving amplifier.

4. The method as claimed in claim 1, wherein the changing the mode using the control signals is based on:
  a supply voltage which serves at least parts of electrical circuits in the external circuit environment or the impedance matching circuit,
  the radiofrequency (RF) power fed into the signal path, or
  the type of the first variable-impedance circuit element, the first variable-impedance circuit element being an external testing circuit, a planar antenna, a planar inverted L antenna (PILA), a planar inverted F antenna (PIFA), or a rod antenna.

5. The method as claimed in claim 1, further comprising synchronizing the controlling of the impedance of the first matching network with the control signals.

6. The method as claimed in claim 1, wherein the controlling the impedance of the first matching network is carried out in an asynchronous manner with respect to the control signals.

7. The method as claimed in claim 1, wherein the phase of the transmission signal changes less than or equal to 15° responsive to the controlling the impedance of the first matching network.

8. The method as claimed in claim 1, wherein the variable-impedance circuit element is an antenna of a mobile communication device.

9. The method as claimed in claim 1, wherein the variable-impedance circuit element is a switching element that electrically connects the impedance matching circuit to an external test circuit.

10. The method as claimed in claim 1, wherein the first matching network includes a switching unit, the switching unit being
- a switchable capacitance matrix using radiofrequency (RF) microelectromechanical systems (MEMS) technology,
- a switchable capacitance matrix using complementary metal-oxide-semiconductor (CMOS) technology,
- a switchable capacitance matrix using n-type metal-oxide-semiconductor (NMOS) or p-type metal-oxide-semiconductor (PMOS) technology,
- a switchable capacitance matrix using gallium arsenide (GaAs) technology,
- a switchable capacitance matrix using silicon-germanium (SiGe) technology,
- a switchable capacitance element using barium strontium titanate (BST) technology,
- a switchable capacitance element using bismuth zinc niobate (BZN) technology,
- a switchable capacitance element using carbon technology,
- a switchable capacitance element with graphene field-effect transistors (FETs),
- a hyperabruptly doped varactor, or
- a switching unit based on technologies that operate with ferroelectric materials.

11. The method as claimed in claim 1, the logic circuit being integrated in a microcontroller, in a baseband chipset, in a radiofrequency (RF) chipset, in an application-specific integrated circuit (ASIC), or in an integrated circuit (IC).

12. The method as claimed in claim 1, wherein the signal path includes radiofrequency (RF) signals propagating in succession or at the same time in a first frequency band and in a second frequency band that differs from the first frequency band.

13. The method as claimed in claim 1, wherein the impedance matching circuit is used in a multiband or multimode mobile radio device.

14. The method as claimed in claim 1, further comprising processing transmission or reception data in the signal path according to a modulation scheme, the modulation scheme being CW (Continuous Wave), GSM (Global System for Mobile communications), W-CDMA (Wide Band Code Division Multiple Access), LTE (Long Term Evolution), OFDM (Orthogonal Frequency Division Multiplex), QAM (Quadrature Amplitude Modulation), COFDM (Coded Orthogonal Frequency Division Multiplex), TCM (Trellis-Coded Modulation), BCM (Block Code Modulation), MLCM (Multilevel Code Modulation), BOC (Binary Offset Carrier), FHSS (Frequency Hopping Spread Spectrum), or DSSS (Direct-Sequence Spread Spectrum).

15. The method as claimed in claim 1, the impedance matching circuit also comprising:
- a second signal line,
- a second variable-impedance circuit element, and
- a second matching network,
- the second matching network being electrically connected to the second signal line and the second signal line being electrically connected to the second variable-impedance circuit element,
- the impedance of the second matching network being regulated or controlled in order to match the impedance of the second signal line to the second variable-impedance circuit element.

16. The method as claimed in claim 15, further comprising:
- controlling the impedance of the first or second matching network and regulating the impedance of the other matching network such that the impedance matching is optimal for the controlled matching network.

* * * * *